(12) United States Patent
Kawasaki et al.

(10) Patent No.: US 6,781,364 B2
(45) Date of Patent: Aug. 24, 2004

(54) ELECTRON DEVICE TESTING APPARATUS HAVING HIGH CURRENT AND LOW CURRENT TESTING FEATURES

(75) Inventors: Yoshitaka Kawasaki, Tokyo (JP); Yoshihiro Hashimoto, Tokyo (JP); Hironori Tanaka, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/340,140

(22) Filed: Jan. 10, 2003

(65) Prior Publication Data

US 2003/0107395 A1 Jun. 12, 2003

Related U.S. Application Data

(63) Continuation of application No. PCT/JP01/06324, filed on Jul. 23, 2001.

(30) Foreign Application Priority Data

Jul. 24, 2000 (JP) .......................................... 2000-222926

(51) Int. Cl.[7] .............................................. G01R 31/28
(52) U.S. Cl. ..................................... 324/158.1; 324/765
(58) Field of Search ............................... 324/73.1, 763, 324/765, 158.1; 714/724, 736

(56) References Cited

U.S. PATENT DOCUMENTS 4,092,589 A * 5/1978 Chau et al. ................. 714/736
5,594,359 A * 1/1997 Hashimoto .................. 324/765
5,917,318 A   6/1999 Kamata
6,275,023 B1 * 8/2001 Oosaki et al. ............. 324/158.1
6,313,657 B1 * 11/2001 Hashimoto .................. 324/763
6,498,473 B1 * 12/2002 Yamabe ...................... 324/158.1

FOREIGN PATENT DOCUMENTS

| JP | 60-18780 | 1/1985 |
|---|---|---|
| JP | 3-68080 | 7/1991 |
| JP | 9-178781 | 7/1997 |

OTHER PUBLICATIONS

English Translation of International Preliminary Examination Report dated Oct. 21, 2002 (3 pages).

Patent Abstracts of Japan; Publication No. 09–178781 dated Jul. 11, 1997 (2 pgs.).

Patent Abstracts of Japan; Publication No. 60–018780 dated Jan. 30, 1985 (2 pgs.).

* cited by examiner

*Primary Examiner*—Minh N. Tang
(74) *Attorney, Agent, or Firm*—Osha & May L.L.P.

(57) ABSTRACT

A testing apparatus for testing an electron device, has a first supply unit that supplies a first current to the electron device; a first feedback circuit which feeds back voltage applied to the electron device to the, first supply unit; a first switch which switches to whether or not connect electrically the electron device to the first feedback circuit; a second supply unit that supplies a second current to the electron device, the second supply unit being separated from the electron device by the first switch.

2 Claims, 3 Drawing Sheets

20*n* adjusts the voltage applied to the electron device 30 to predetermined voltage based on the fed-back voltage. Moreover, the direct-current testing apparatus 20*a* . . . 20*n* detects the current supplied to the electron device 30 when predetermined voltage is applied to the electron device 30. The testing apparatus 100 judges the quality of an electron device 30 based on the detected current.

ELECTRON DEVICE TESTING APPARATUS HAVING HIGH CURRENT AND LOW CURRENT TESTING FEATURES

This application is con of PCT/JP01/06324 filed Jul. 23, 2001.

This patent application claims priority based on a Japanese patent application, 2000-222926 filed on Jul. 24, 2000, the contents of which are incorporated herein by reference.

BACKGROUND OF THE INVENTION

1. Field of the Invention

The present invention relates to a testing apparatus for testing an electron device. More particularly, the present invention relates to a testing apparatus, which has an apparatus for a high current testing, and an apparatus for a low current testing.

2. Description of the Related Art

FIG. 1 shows a conventional testing apparatus 100. The testing apparatus 100 comprises a direct-current testing apparatus 10 for a high current and one or more direct-current testing apparatus 20*a* . . . 20*n* for a low current. The direct-current testing apparatus 10 is an apparatus, which supplies higher current than the direct-current testing apparatus 20*a* . . . 20*n*. The electron device 30 to be tested has a plurality of electrodes, each of which is connected to corresponding switches 12-1 . . . 12-*n*, switches 14-1 . . . 14-*n*, switches 16-1 . . . 16-*n*, switches 18-1 . . . 18-*n*. Switches 12-1 . . . 12-*n* and 18-1 . . . 18-*n* are each connected to a sense line 22 and a force line 26 of the direct-current testing apparatus 10. As shown in FIG. 1, switches 14-1 . . . 14-*n* are each connected to corresponding sense lines 28*a* . . . 28*n* of the direct-current testing apparatus 20*a* . . . 20*n* and switches 16-1 . . . 16-*n* are each connected to corresponding force lines 30*a* . . . 30*n* of the direct-current testing apparatus 20*a* . . . 20*n*. Further, the testing apparatus 100 has a measure line 24 selectively connecting the direct-current testing apparatus 10 and direct-current testing apparatus 20*a* . . . 20*n*.

The testing apparatus 100 performs a voltage applying current measuring test, which applies predetermined voltage on an electron device 30 to measure a current supplied to the electron device 30, or performing an electric current applying voltage measuring test, which supplies predetermined electric current to the electron device 30 to measure a voltage applied on the electron device 30.

The testing apparatus 100 will be explained below using a voltage applying current measuring test as an example. When a high current must be supplied to the electron device 30, the direct-current testing apparatus 10 applies voltage to the electron device 30 through the force line 26. The voltage applied to the electron device 30 is fed back to the direct-current testing apparatus 10 through the sense line 22. The direct-current testing apparatus 10 adjusts the voltage applied to the electron device 30 to the predetermined voltage based on the fed-back voltage. Moreover, the direct-current testing apparatus 10 detects the current supplied to the electron device 30 when predetermined voltage is applied to the electron device 30. The testing apparatus 100 judges the quality of an electron device 30 based on the detected current.

When a low current must be supplied to the electron device 30, the direct-current testing apparatus 20*a* . . . 20*n* applies voltage to the electron device 30. The voltage applied to the electron device 30 is fed back to the direct-current testing apparatus 20*a* . . . 20*n*. The direct-current testing apparatus 20*a* . . . 20*n* adjusts the voltage applied to the electron device 30 to predetermined voltage based on the fed-back voltage. Moreover, the direct-current testing apparatus 20*a* . . . 20*n* detects the current supplied to the electron device 30 when predetermined voltage is applied to the electron device 30. The testing apparatus 100 judges the quality of an electron device 30 based on the detected current.

When the testing is performed by applying voltage to the electron device 30 from the direct-current testing apparatus 10, the corresponding switches 12-1 . . . 12-*n* and 18-1 . . . 18-*n* are switched-on, and the switches 14-1 . . . 14-*n* and 16-1 . . . 16-*n* are switched-off. When the testing is performed by applying voltage to the electron device 30 from the direct-current testing apparatus 20*a* . . . 20*n*, the corresponding switches 14-1 . . . 14-*n* and 16-1 . . . 16-*n* are switched-on and the switches 12-1 . . . 12-*n* and 18-1 . . . 18-*n* are switched-off.

The electron device 30 has a plurality of electrodes to be tested, and the testing apparatus 100 has the direct-current testing apparatuses 20 for each electrode. The testing apparatus 100 performs testing by choosing the desired electrodes using the switches 12-1 to 12-*n*, the switches 14-1 to 14-*n*, the switches 16-1 to 16-*n*, and the switches 18-1 to 18-*n*, which are provided for each plurality of electrodes. Moreover, the testing apparatuses that perform other tests are also connected to the plurality of the electrodes of the electron device 30.

The testing apparatus 100 mentioned above switches-off switches 12-1 . . . 12-n, when the testing apparatus 100 is separated from the electron device 30. Each of the switches has a floating capacity, called off capacity. Since the off capacity is large, the value measured by the testing apparatus that performs other test is affected when the switches 12-1 . . . 12-*n*, 14-1 . . . 12-*n*, 16-1 . . . 12-*n* and 18-1 . . . 12-*n* are switched-off. Thus, it was difficult to test the electron device 30 with sufficient accuracy. Therefore, it was desired to reduce the off capacity of the switch that separates the testing apparatus 100 and the electron device 30.

SUMMARY OF THE INVENTION

Therefore, it is an object of the present invention to provide a testing apparatus which overcomes the above issues in the related art. This object is achieved by combinations described in the independent claims. The dependent claims define further advantageous and exemplary combinations of the present invention.

To solve the above issues, according to the first aspect of the present invention, a testing apparatus for testing an electron device comprises a first supply unit that supplies a first current to the electron device; a first feedback circuit which feeds back voltage applied to the electron device to the first supply unit; a first switch which switches to whether or not connect electrically the electron device to the first feedback circuit; and a second supply unit that supplies a second current to the electron device, the second supply unit being separated from the electron device by the first switch.

In the first aspect of the present invention, the first supply unit may adjust a voltage or a current to be supplied to the electron device based on the voltage, which is fed back by the first feedback circuit. Moreover, the testing apparatus may further comprise a second switch that switches to whether or not connect electrically the first supply unit to the electron device. The testing apparatus may further comprise: a third switch that selects to whether or not connect electrically the first feedback circuit to the first supply unit; and a fourth switch that selects to whether or not connect electrically the second supply unit to the electron device via the first switch. The second current may be lower than the first current.

The first feedback circuit may have a voltage follower circuit that outputs a voltage substantially equal to an input voltage, and the input impedance of the voltage follower circuit is higher than the output impedance of the voltage follower circuit. The second supply unit may have a supply source that supplies the second current to the electron device and a feedback path that feeds back the voltage applied to the electron device to the supply source; and the supply source adjusts the voltage or current to be output to the electron device based on the voltage fed back by the feedback path.

The electron device may have a plurality of electrodes; and the first supply unit may supply the first current to each plurality of electrodes; and the testing apparatus may further comprise: a plurality of the first feedback circuits, each of which feeds back voltage applied to the plurality of electrodes to the first supply unit, respectively; a plurality of the first switches, each of which switches to whether or not connect electrically the plurality of electrodes to the plurality of first feedback circuits; and a plurality of second supply units, each of which supplies a second current, which is lower than a current that is supplied by the first supply unit, to each of the plurality of electrodes, and the plurality of second supply units are separated from the plurality of electrodes by the plurality of the first switches, respectively. The testing apparatus may further comprising a judging unit that judges quality of the electron device based on the detected voltage or current supplied to the electron device detected by one of the first supply unit and a plurality of the second supply units.

According to the second aspect of the present invention, a testing apparatus for testing an electron device comprises: a first supply unit that supplies a first current to the electron device; a supply line that connects electrically the electron device and the first supply unit, and the first current flowing therethrough; a first feedback circuit which feeds back voltage applied to the electron device to the first supply unit; a second switch provided on the supply line which switches to whether or not connect electrically the electron device and the first supply unit; and a second supply unit that supplies a second current to the electron device, the second supply unit being separated from the electron device by the second switch.

The testing apparatus may further comprise: a fifth switch that selects to whether or not connect electrically the first supply unit to the electron device via the second switch; and a sixth switch that selects to whether or not connect electrically the second supply unit to the electron device via the second switch. The second current may be lower than the first current.

The electron device may have a plurality of electrodes; and the testing apparatus further comprising: a plurality of the supply line that connects electrically the electron device and the first supply unit, and the first current, which is supplied to each of the plurality of electrodes by the first supply unit, flowing therethrough; and a plurality of first feedback circuits, each of which feeds back voltage applied to the plurality of electrodes to the first supply unit, respectively; a plurality of the second switches provided on the supply line, each of which switches to whether or not connect electrically the plurality of electrodes to the first supply unit; and a plurality of the second supply units, each of which supplies a second current, which is lower than the current that is supplied by the first supply unit, to the plurality of electrodes, and the second supply units are separated from the plurality of electrodes by the plurality of second switches.

This summary of the invention does not necessarily describe all necessary features of the present invention. The present invention may also be a sub-combination of the above described features. The above and other-features and advantages of the present invention will become more apparent from the following description of embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
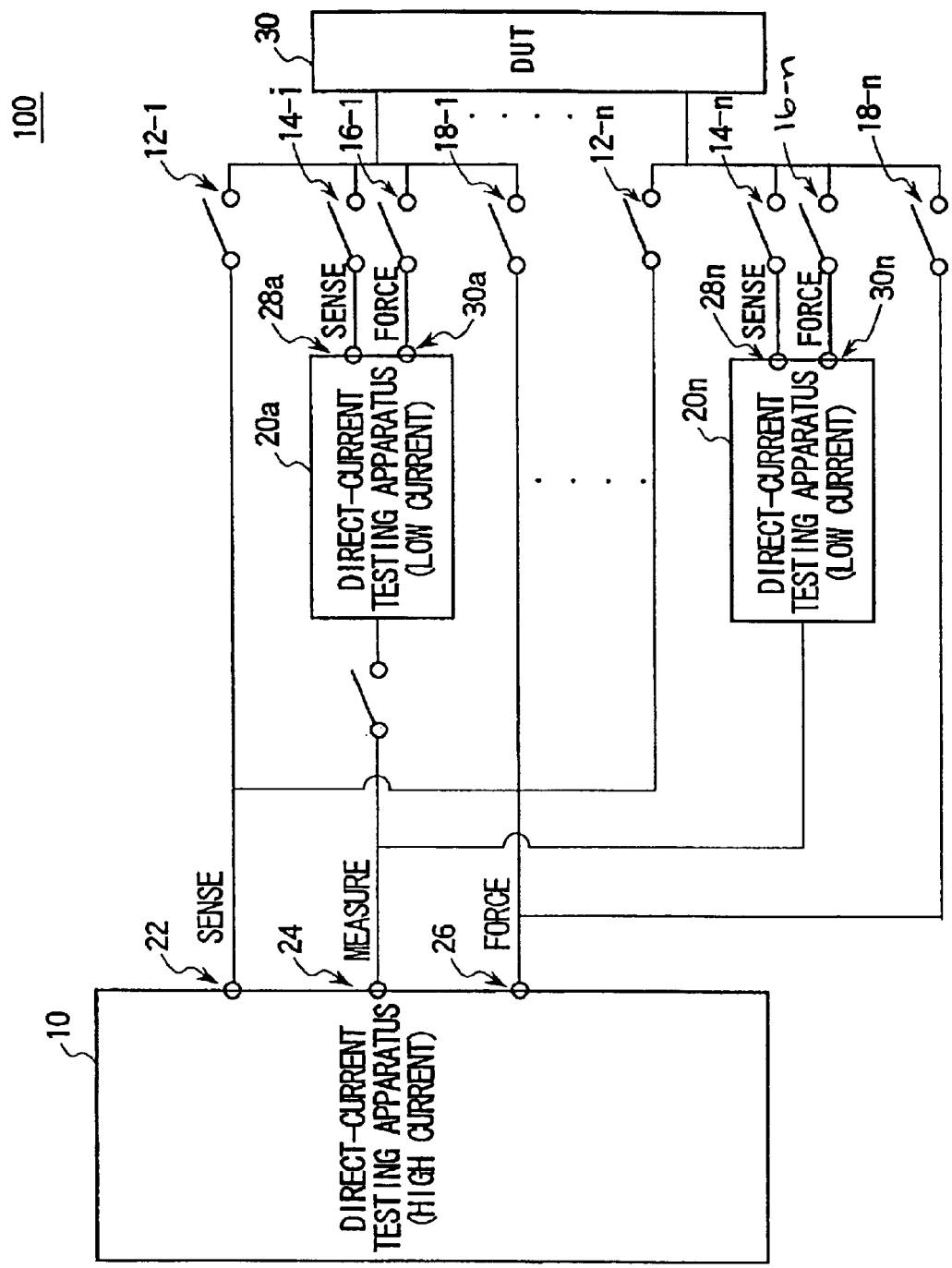
FIG. 1 shows a configuration of a conventional testing apparatus 100.
Figure 2A:
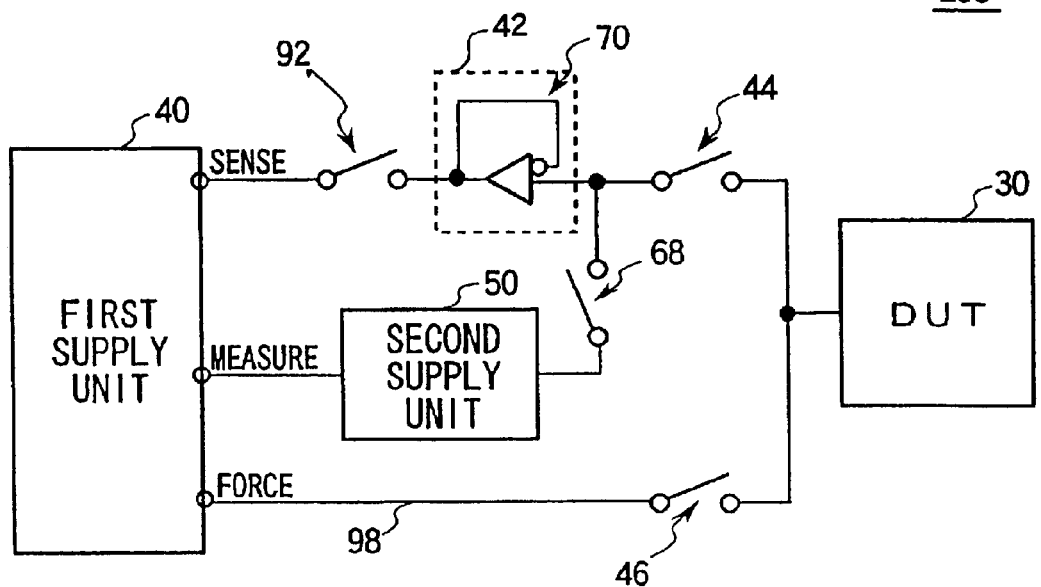
FIGS. 2A and 2B show examples of the configuration of a testing apparatus 200 in the present embodiment.
Figure 2B:
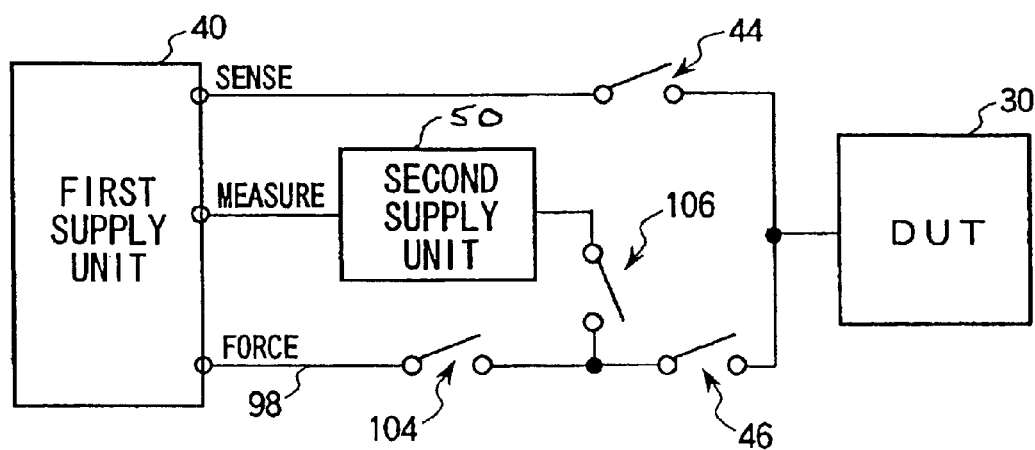

FIGS. 2A and 2B show examples of the configuration of a testing apparatus 200 in the present embodiment. The testing apparatus 200 comprises a first supply unit 40, a second supply unit 50, a first feedback circuit 42, a switch 44, a switch 46, a switch 68, a switch 92, and a supply line 98. The first supply unit 40 supplies a first current to an electron device 30, and the second supply unit 50 supplies a second current, which is lower than the first current.

The first feedback circuit 42 feeds back the voltage applied to the electron device 30 to the first supply unit 40. The switch 44 switches to whether or not connect electrically the first feedback circuit 42 to the electron device 30. Moreover, the second supply unit 50 is separated from the electron device 30 by the first switch 44.

The switch 46 is provided on the supply line 98 that connects electrically the electron device 30 and the first supply unit 40. The first current, which is supplied by the first supply unit 40, is flowing through the switch 46. The switch 46 switches to whether or not connect electrically the first supply unit 40 and the electron device 30. The switch 92 switches to whether or not connect the first supply unit 40 to the first feedback circuit 42. The switch 68 selects to whether or not connect electrically the second supply unit 50 to the electron device 30 via the switch 44.

Moreover, although the second supply unit 50 is connected to the electron device 30 via the switch 44 in this example, the second supply unit 50 may be connected to the electron device 30 via the switch 46 as shown in FIG. 2B.

FIG. 2B shows another embodiment of the testing apparatus 200. The testing apparatus 200 comprises a first supply unit 40, a supply line 98, a switch 44, a switch 46, and a second supply unit 50. The element shown in FIG. 2B, which has the may have the same or similar functions and configurations with that of the element shown in FIG. 2A.

The second supply unit 50 is connected to the electron device 30 via the switch 46. A switch 104 selects to whether or not connect electrically the first supply unit 40 to the electron device 30 via the switch 46. A switch 106 selects to whether or not electrically the second supply unit 50 to the electron device 30 via the switch 46.

Figure 3:
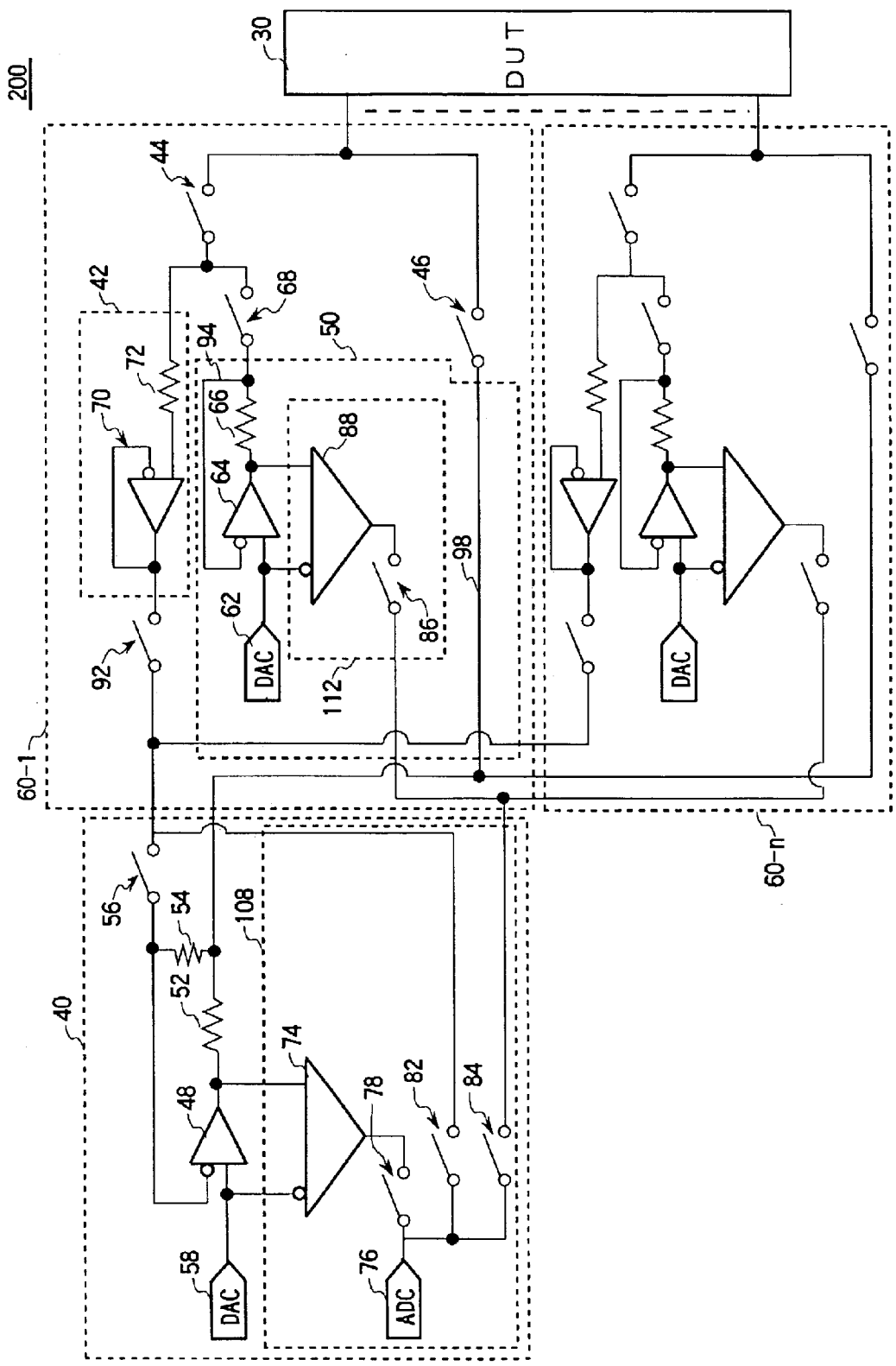
FIG. 3 shows an example of the circuit configuration of the testing apparatus 200 shown in FIG. 2A.

FIG. 3 shows an example of the circuit configuration of the testing apparatus 200 shown in FIG. 2A. The testing apparatus 200 comprises the first supply unit 40, the second supply unit 50, the first feedback circuit 42, the switch 44, the switch 46, the supply line 98, the switch 68, and the switch 92.

The element shown in FIG. 3, which has the same reference numeral with the reference numeral of the elements shown in FIG. 2A, may have the same or similar functions and configurations with that of the element shown in FIG. 2A.

The testing apparatus 200 performs the voltage applying current measuring test, which applies a predetermined voltage to the electron device 30 and detects the current which is supplied to the electron device 30, and the current applying voltage measuring test, which supply a predetermined current to the electron device 30 and detects the voltage that is applied to the electron device 30. The testing apparatus 200 is explained below using the case where the voltage applying current measuring test is performed.

The first supply unit 40 has a voltage generating unit 58, which generates voltage, a voltage adjustment unit 48, which adjusts voltage, a resistor 52, a resistor 54, a switch 56, and a first detection unit 108. The first supply unit 40 is connected to the electron device 30 via the switch 46. The first supply unit 40 applies voltage to the electron device 30. The voltage applied to the electron device 30 is fed back to the first supply unit 40 through the first feedback circuit 42. The first supply unit 40 adjusts the voltage, which is to be applied to the electron device 30, to a predetermined voltage based on the fed-back voltage. Moreover, when the current applying voltage measuring test is performed, the first supply unit adjusts the current supplied to the electron device 30 to predetermined current.

The voltage generating unit 58 may be a digital analog converter (DAC), to which predetermined voltage value is provided by the digital signal, that converts the provided digital signal to an analog signal. The voltage generating unit 58 applies the voltage, which is based on the provided voltage value, to the electron device 30 through the voltage adjustment unit 48, the resistor 52, and the switch 46.

The voltage adjustment unit 48 applies the voltage, which is based on the voltage fed back by the first feedback circuit 42, to the electron device 30 through the resistor 52 and the second switch 46. That is, the voltage adjustment unit 48 applies the voltage to the resistor 52 so that the voltage, which is generated by the voltage generating unit 58, becomes equal to the voltage, which is applied to the electron device 30. The voltage adjustment unit 48 may be an amplifier, for example.

The first detection unit 108 has a detection unit 74, a converter 76, a switch 78, a switch 82, and a switch 84. The first detection unit 108 detects the current supplied to the electron device 30 when the first supply unit 40 applies predetermined voltage to the electron device 30.

The detection unit 74 detects the value of the current, which is supplied to the electron device 30 by the first supply unit 40. The detection unit 74 detects the value of the current, which flows to the resistor 52 of the first supply unit 40. That is, the detection unit 74 detects the amount of voltage drop in the resistor 52 by detecting the difference between the input voltage and the output voltage of the adjustment unit 48. Since the resistance of the resistor 52 is known, a current value is calculated from the amount of voltage drop.

The detection unit 74 provides the detected amount of voltage drop to the converter 76 through the switch 78. The converter 76 may be an analog digital converter (ADC) that converts analog data to digital data. The converter 76 converts the provided amount of voltage drop to digital data. The testing apparatus 200 may have a judging unit which judges the quality of the electron device based on the digital data converted by the converter 76.

In this example, the first detection unit 108 detects the current value supplied to the electron device 30. When the current applying voltage measuring test is performed, the first detection unit 108 may detect the voltage value applied to the electron device 30.

The first feedback circuit 42 may have a voltage follower circuit 70 which outputs voltage substantially equal to the input voltage. The input impedance of the first feedback circuit 42 is higher than the output impedance the first feedback circuit 42. The voltage follower circuit 70 may have an amplifier, for example. The voltage follower circuit 70 may have an amplifier, the input impedance of which is substantially infinite or sufficiently higher than the impedance of surrounding circuits, and the output impedance of which is substantially zero, and the gain of which is sufficiently high.

The switch 92 selects to whether or not connect electrically the first feedback circuit 42 to the first supply unit 40. The switch 68 selects to whether or not connect electrically the second supply unit 50 to the electron device 30 via the switch 44.

The second supply unit 50 has a supply source that supplies the second current to the electron device 30, a feedback path 94 that feeds back the voltage, which is applied to the electron device 30, to the supply source, a resistor 66, and a second detection unit 112. The second supply unit 50 is connected to the electron device 30 via the first switch 44. The second supply unit 50 applies the predetermined voltage to the electron device 30.

The supply source has the voltage generating unit 62, which generates voltage, and the voltage adjustment unit 64, which adjusts voltage. The voltage generating unit 62 may be a digital analog converter, to which the predetermined voltage value is provided by the digital signal, that converts the provided digital signal to an analog signal. The voltage generating unit 62 applies the voltage, which is based on the provided voltage value, to the electron device 30 through the voltage adjustment unit 64, the resistor 66, the switch 68, and the first switch 44.

The voltage adjustment unit 64 applies the voltage, which is based on the voltage fed back by the feedback path 94 to the electron device 30 through the resistor 66, the switch 68, and the first switch 44. That is, the voltage adjustment unit 64 applies the voltage to the resistor 66 so that the voltage, which is generated by the voltage generating unit 62, and the voltage, which is applied to the electron device 30, become equal. The voltage adjustment unit 64 may be an amplifier, for example.

The supply source may change the voltage or current supplied to the electron device 30 based on the voltage fed back by the feedback path 94. In case of the voltage applying current measuring test, the supply source adjusts the voltage, which is to be supplied to the electron device 30, to the predetermined voltage based on the fed-back voltage. Moreover, when the current applying voltage measuring test is performed, the supply source adjusts the current, which is to be supplied to the electron device 30, to a predetermined current.

The second detection unit 112 has a detection unit 88 and a switch 86. The detection unit 88 detects the current value, which is supplied to the electron device 30 by the second supply unit 50. The detection unit 88 detects the current value which flows to the resistor 66 of the second supply unit 50. That is, the detection unit 88 detects the amount of voltage drop in the resistor 66 by detecting the difference of the input voltage and the output voltage of the adjustment unit 64. Since the resistance of the resistor 66 is known, a current value is calculated from the amount of the voltage drop. The detection unit 88 provides the detected amount of voltage drop to the converter 76 of the first detection unit through the switch 86 and the switch 84.

When high current is supplied to the electron device 30, predetermined voltage is applied to the electron device 30 from the first supply unit 40 by short-circuiting the switch 46, the switch 44, the switch 92, and the switch 56. When a low current is supplied to the electron device 30, a predetermined voltage is applied to the electron device 30 from the second supply unit 50 by short-circuiting the switch 68 and the switch 44.

If the electron device 30 has a plurality of electrodes to be tested, the testing apparatus 200 may have a plurality of testing units (from 60-1 to 60-*n*) corresponding to each of the plurality of the electrodes where "n" is a natural number. Each of the plurality of testing units 60-1 . . . 16-*n* may have the same configuration and the same function, respectively. For example, as shown in FIG. 3, the testing unit 60-1 has the second supply unit 50, the first feedback circuit 42, the switch 44, the switch 46, the switch 92, and the switch 68.

Each of the elements of the testing unit 60-1 has the configuration and the function, which is explained in relation with FIG. 3. Other testing units 60-1 . . . 16-*n* may have the same or similar configuration and function with that of the testing unit 60-1. The first supply unit 40 supplies the first current to each of the plurality of electrodes of the electron device 30. Each of the first feedback circuits 42 of the testing unit 60 feeds back the voltage applied to the plurality of the electrodes to the first supply unit, respectively. Each of the switches 44 of the testing unit 60 switches to whether or not connect electrically the plurality electrodes to the plurality first feedback circuits 42.

Each of the second supply units 50 of the testing unit 60-1 . . . 16-*n* is separated from the plurality of electrodes by the plurality of switches 44. Each of the second supply units 50 supplies the second current, which is lower than the current that is supplied by the first supply unit 40, to the plurality of electrodes, respectively. The second current provided by the plurality of second supply units 50 may have different values, respectively.

Moreover, the detection unit 74 of the first detection unit 108 may generate digital data based on the current value, which is detected by the first detection unit 108 or the second detection units 112 included in one of the first supply units 40 or the plurality of second supply units 50. The switch 78, the switch 84, and the plurality of switches 86 included in the plurality of testing units 60-1 . . . 16-*n* select the current values detected by the detection units to be converted to digital data.

In FIG. 3, the example in which the second supply unit 50 is electrically connected to the electron device 30 via the switch 44 was explained. However, as explained in FIG. 2B, the second supply unit 50 may be connected electrically to the electron device 30 via the switch 46 as other examples.

Moreover, in this example, the second supply unit 50 supplies the current, which is lower than the current that is supplied by the first supply unit 40. However, the second supply unit 50 may supply the current, which is higher than the current that is supplied by the first supply unit 40 as other examples.

According to the testing apparatus 200 in the present embodiments explained above, the number of the switches for separating the testing apparatus 200 from the electron device 30 can be reduced compared with the conventional testing apparatus. Therefore, the off capacity of a switch can be reduced so that it becomes possible to perform accurate testing.

As clear from the above explanation, according to the present embodiment, it becomes possible to reduce the off capacity of the switch for separating the testing apparatus 200. Therefore, it becomes possible to test an electron device 30 with better accuracy.

Although the present invention has been described by way of exemplary embodiments, it should be understood that many changes and substitutions may be made by those skilled in the art without departing from the spirit and the scope of the present invention which is defined only by the appended claims.

What is claimed is:

1. A testing apparatus for testing an electron device, comprising:

a first supply unit that supplies a first current to said electron device;

a supply line that connects electrically said electron device and said first supply unit, and said first current flowing therethrough;

a first switch provided on said supply line which switches to whether or not connect electrically said electron device and said first supply unit;

a second supply unit that supplies a second current to said electron device, said second supply unit being separated from said electron device by said first switch;

a second switch that selects to whether or not connect electrically said first supply unit to said electron device via said first switch; and a third switch that selects to whether or not connect electrically said second supply unit to said electron device via said first switch.

2. The testing apparatus as claimed in claim 1, wherein said second current is lower than said first current.

* * * * *